United States Patent [19]
Carlson et al.

[11] Patent Number: 5,028,878
[45] Date of Patent: Jul. 2, 1991

[54] DUAL MEMORY TIMING SYSTEM FOR VLSI TEST SYSTEMS

[75] Inventors: Mark E. Carlson; Marc R. Mydill, both of Gardland, Tex.

[73] Assignee: Texas Instruments Incorporated, Dallas, Tex.

[21] Appl. No.: 435,127

[22] Filed: Nov. 13, 1989

[51] Int. Cl.[5] .................. H03L 7/00; G01R 31/28
[52] U.S. Cl. .................... 328/62; 307/269; 328/63; 377/26
[58] Field of Search .......... 328/62, 63; 307/269; 377/26

[56] References Cited

U.S. PATENT DOCUMENTS

| | | | |
|---|---|---|---|
| 4,420,696 | 12/1983 | Gemma et al. | 307/269 |
| 4,553,100 | 11/1985 | Nishiura | 328/63 |
| 4,644,195 | 2/1987 | Miller et al. | 328/62 |
| 4,855,681 | 8/1989 | Millham | 377/26 |

Primary Examiner—John S. Heyman
Attorney, Agent, or Firm—B. Peter Barndt; James T. Comfort; Melvin Sharp

[57] ABSTRACT

A timing system using shared address generator(s) to address memories that form the basis of each pin's timing reference generator can reduce the amount of hardware required to implement a "Timing Generator Per Pin" architecture in a VLSI tester by at least 50%.

17 Claims, 2 Drawing Sheets

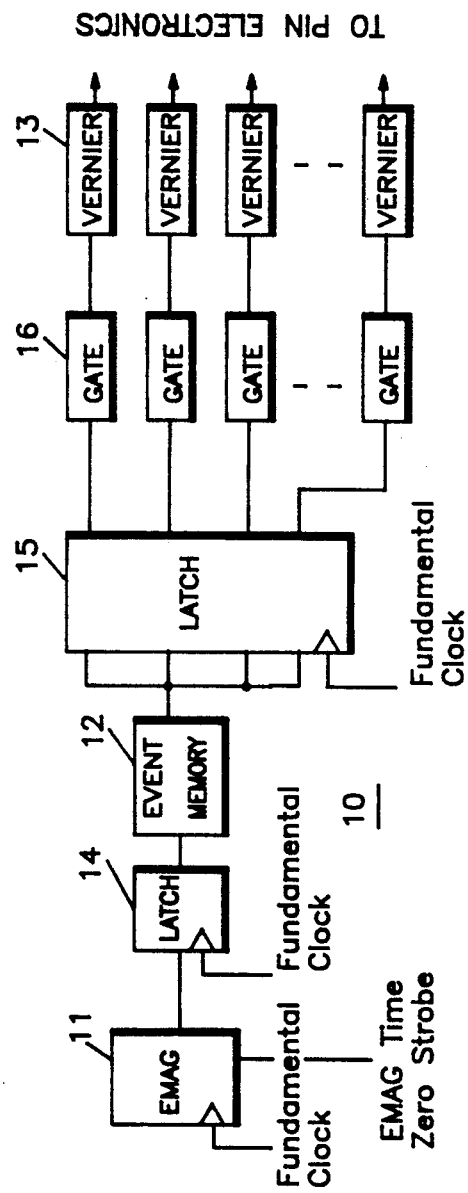
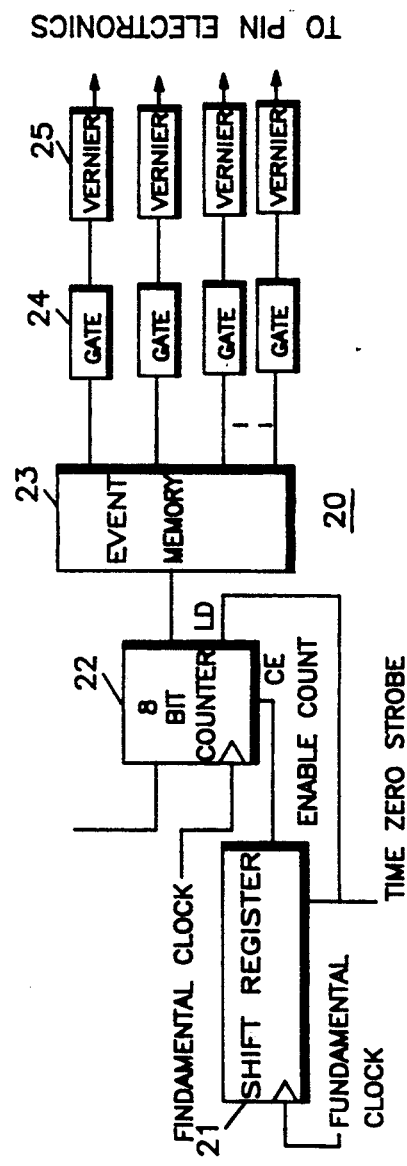

DUAL MEMORY TIMING SYSTEM FOR VLSI TEST SYSTEMS

FIELD OF THE INVENTION

This invention relates to VLSI Test Systems, and more particularly to timing reference generators in such testing systems.

BACKGROUND OF THE INVENTION

Timing in a VLSI tester can be generated in several ways. Some systems employ centrally located generators that provide a small number of timing references or edges that are distributed to test electronics on a shared basis. This provides a savings in hardware cost at the expense of programming flexibility. Others have separate and complete timing generators for each edge needed by every pin. This requires more hardware but it allows the system programmer to have the most flexibility in writing a device test program. In a timing system using shared address generator(s) to provide an address to shallow memories behind the timing reference generators, the tradeoff between totally shared resources and complete independence is balanced to allow at least a 50% reduction in the cost of the timing system without restricting the basic flexibility of a "TIMING PER PIN ARCHITECTURE".

VLSI test systems generally fall in two categories. One category is "SHARED RESOURCE" in which a small number of timing generators are distributed to the test pins on a shared basis. The second category is "PER PIN ARCHITECTURE" that duplicates timing generation circuitry for each pin. Both of these categories generally use counter circuits to generate sychronous course delays and various type of vernier circuits to generate finer delays. The main difference between the "shared resource" and the "per pin" systems with regard to timing generators is the number of counters and verniers required.

In a conventional VLSI tester with timing generators available on per pin basis, every generator uses a binary counter to count the number of clock cycles between the time zero reference and the carry signal that triggers a vernier, or finer delay circuit. If the timing can change "ON THE FLY" (from test pattern to test pattern as a functional test is executed), then each counter will require memory behind it to dictate what the digital count will be for that edge on that cycle. This combination of memory and counter behind every edge can result in a large amount of circuitry in systems with many pins and several edges per pin. This translates into large, costly machines to test VLSI parts, and directly impacts the test cost and hence the profitability of manufacturing the parts.

Other systems use a counter to directly address the memory that generates the edge. This scheme requires a very deep memory behind every edge due to the need for memory locations that correspond to each fundamental clock cycle that will occur between consecutive time zero markers. This is generally practical only when a small number of timing edges are provided (as in a shared resource architecture).

BRIEF SUMMARY OF THE INVENTION

In a dual memory based timing system an address is generated by shared address generator(s) once every fundamental clock cycle of the tester. The fundamental clock is the one that would normally be clocking the digital counters used for the synchronous, course delays. This address is than used to address memories which serve as edge generators. For example, an N×4 memory will provide an output to 4 edges. The data that comes out of these memories then determines which edge or edges will be generated during a particular fundamental clock cycle.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTION OF THE DRAWINGS

FIG. 1 illustrates an Event Memory Address Generator;

FIG. 2 illustrates a second embodiment of an Event Memory Address Generator.

DESCRIPTION OF A PREFERRED EMBODIMENT OF THE INVENTION

Figure 3:
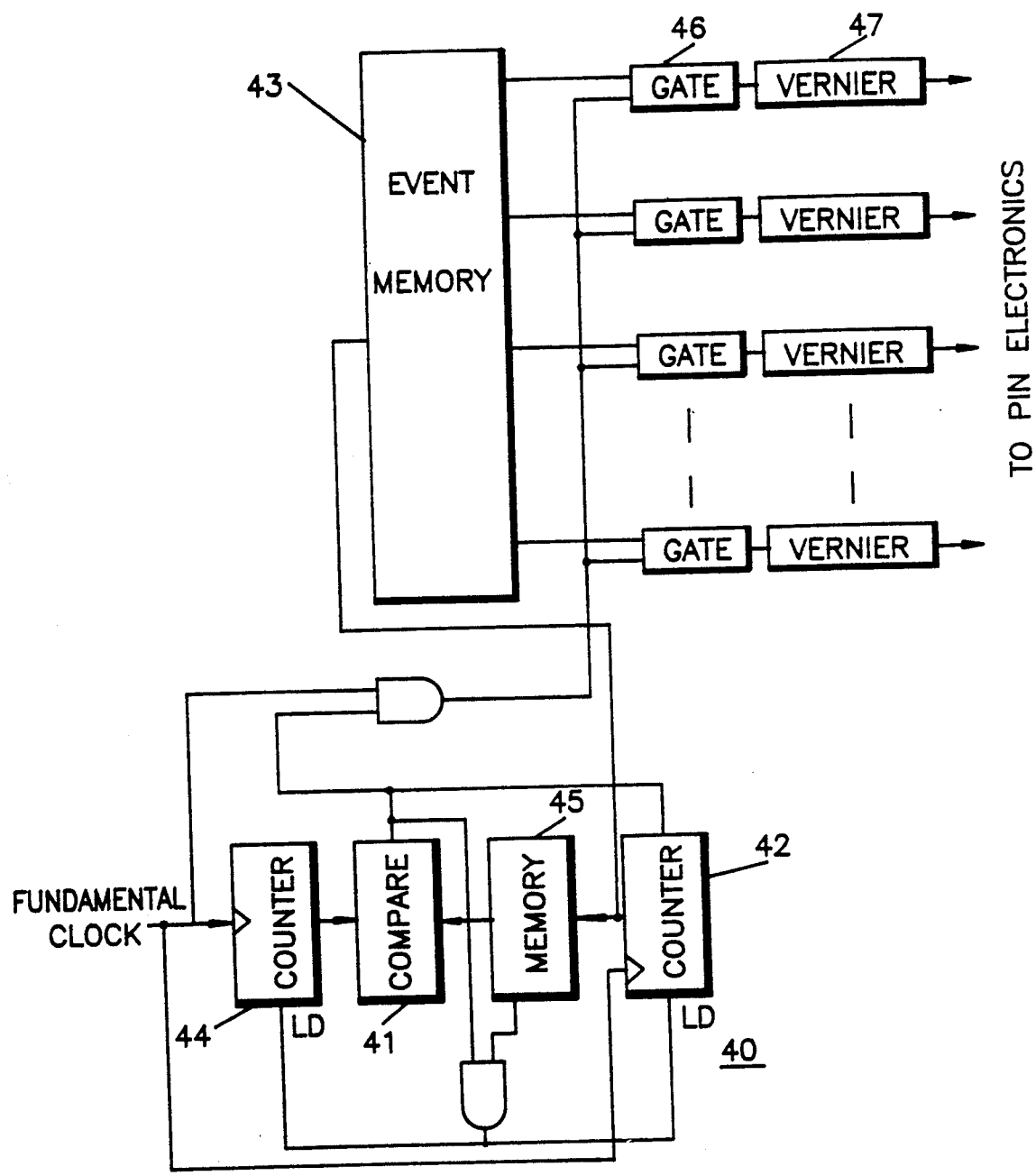
FIG. 3 illustrates a further embodiment of an Event Memory Address Generator.

FIG. 1 illustrates one implementation of the address generator 10 (called the "EVENT MEMORY ADDRESS GENERATOR" or "EMAG"). A large memory in the EMAG 11 circuitry has locations reserved in it for every fundamental cycle that will occur between consecutive time zero markers. If any pin requires an edge during a particular cycle, the EMAG will have a location containing address that points to a location in the "EVENT MEMORY" 12 (the memory creating the individual edges) which contains a data word whose bits drive the timing verniers. What makes this system unique is that during a cycle in which no edges are required, the EMAG will contain a no-op address (probably location >00).

This allows the no-op address in the EVENT MEMORY to be used whenever edges are not required by any pins during a cycle. Latches 14 and 15 are required to maintain synchronization with the fundamental clock cycle during high speed operation. Logic gates 16 are used for further synchronization before triggering the timing verniers 13. The event memory is therefore relatively shallow. This provides the most flexibility because the address that is sent to the event memory can be totally random. The EMAG in this embodiment requires several large memories (at least 16 k bits per memory) and the associated circuitry to implement it.

Another implementation 20 of the EMAG, FIG. 2, uses a shift register 21 or a 1 bit wide memory to provide the count enable to counter 22 which provides the address to the event memory 23. The output of the event memory then provides triggering for the timing verniers 25 as described above with reference to the timing verniers of FIG. 1. Because of the requirement that the EVENT MEMORY 23 data be accessed sequentially, entering new data requires everything at and above the entry address to be moved one location to make room for the inserted data. The advantage of this method is that by using one bit to control a counter which sequentially accesses the EVENT MEMORY, the amount of EMAG hardware is reduced. Additional latches used as pipeline routes (not shown) may be required to support high speed operation.

A third implementation of the EMAG 40, illustrated in FIG. 3, uses a comparator 41 to provide the count enable to a counter 42 that accesses the event memory 43. One input to the comparator comes from counter 44 running at the fundamental clock frequency. A second comparator input comes from a shallow memory 45 that is addressed by counter 42 which is incremented whenever the comparator inputs match. One bit of the output of the shallow memory 45 can be used to delineate test cycle boundaries. The event memory 43 outputs a timing edge synchronized via logic gates 46, and provides triggering for timing verniers 47. This circuit's advantage comes from the smaller amount of hardware and the shallow memory that is required to build it. The speed requirements of the components in this circuit are much more critical than those in the other methods. This implementation works very well for systems running at a relatively slow frequency.

What is claimed is:

1. A dual memory based timing system, for VLSI test systems, for generating an address to determine which timing edge will be used during a fundamental clock cycle between consecutive time zero markers, comprising:
    an Event Memory for storing data representative of which edges will be generated during a particular clock cycle;
    an Event Memory Address Generator for storing locations for each fundamental cycle that will occur between consecutive zero markers, which address locations point to a respective location in the Event Memory; and
    at least one latch connected to the Event Memory to maintain synchronization of a timing edge with the fundamental clock cycle during operation.

2. The timing system according to claim 1, including timing verniers receiving the output of the Event Memory for supplying the required edge to the test system.

3. The timing system according to claim 1, wherein the event memory provides the timing edge to be used during a particular clock cycle.

4. The timing system according to claim 1, wherein the event memory provides a no-op address location when no edges are required during a fundamental clock cycle.

5. The timing system according to claim 1, wherein the event memory address generator that provides the address to the event memory is comprised of a counter and memory.

6. The timing system according to claim 5, wherein a shift register is used to provide a count enable to the counter which provides the address to the event memory.

7. The timing system according to claim 6, wherein the event memory provides triggering for timing verniers which receive the output of the Event Memory for supplying the required edge to the test system.

8. The timing system according to claim 6, wherein the event memory is accessed sequentially.

9. A dual memory based timing system, for a VLSI test system, for generating an address to determine which timing edge will be used during a fundamental clock cycle between consecutive time zero markers, comprising:
    a first counter;
    a comparator to provide a count enable to said first counter;
    a shallow memory addressed by said first counter and provides an input to said comparator;
    a second counter for providing another input to said comparator,
    said first counter being incremented when the input to the comparator from the shallow memory matches the input from the second counter; and
    an event memory which is addressed by the output of said first counter;
    the event memory providing a timing output in response to the input resulting from the incremented first counter.

10. The timing system according to claim 9, including timing verniers and logic gates, the logic gates providing a timing input to the timing verniers when the logic gates are enabled by an input derived from the event memory and the fundamental clock.

11. A method for generating timing edges for every fundamental clock cycle in a VSLI test system that occurs between consecutive timing zero markers, comprising the steps of:
    storing timing vernier trigger data in an event memory for every fundamental cycle that occurs between consecutive time zero markers; the event memory providing an output in response to an incremented counter and the incremented counter being incremented by a comparator output;
    storing in a second memory a location containing addresses that point to locations in said event memory; and
    creating a timing edge from the data at the address in said event memory.

12. The method according to claim 11, a no-op address is stored when no timing edge is required.

13. The method according to claim 11, including the step of synchronizing the timing edges with a fundamental clock cycle during high speed operation.

14. The method according to claim 11, including the step of adjusting timing delays with timing verniers.

15. The method according to claim 11, including the step of providing the output of a 1 bit wide memory to increment a counter which provides the address to said event memory.

16. The method according to claim 15, wherein the event memory is accessed sequentially.

17. The method according to claim 11, including the step of comparing the output of a memory and a counter driven by a fundamental clock.

* * * * *